United States Patent [19]

Colardelle et al.

[11] 4,325,055
[45] Apr. 13, 1982

[54] ANALOG-TO-DIGITAL CONVERTER

[75] Inventors: Joël S. Colardelle, Les Ulis; Pierre Girard, Septeuil; Jean-Pierre M. Pillou, Saint-Egreve, all of France

[73] Assignee: International Standard Electric Corporation, New York, N.Y.

[21] Appl. No.: 88,670

[22] Filed: Oct. 26, 1979

[30] Foreign Application Priority Data

Oct. 27, 1978 [FR] France ................. 78 30541

[51] Int. Cl.³ .......................................... H03K 13/09
[52] U.S. Cl. ............................................ 340/347 AD
[58] Field of Search ........ 340/347 AD, 347 C, 347 M

[56] References Cited

U.S. PATENT DOCUMENTS 3,626,408 12/1971 Carbrey ........................ 340/347 M
3,631,468 12/1971 Spaid ............................ 340/347 M
4,072,938 2/1978 Buchanan ..................... 340/347 AD

OTHER PUBLICATIONS

Lagarde, "Cables & Transmissions", vol. 28, Jul. 1974, pp. 217-231.

Primary Examiner—Charles D. Miller
Attorney, Agent, or Firm—John T. O'Halloran; Alfred C. Hill

[57] ABSTRACT

An analog-to-digital converter using MOS-charge redistribution techniques performs an N-bit analog-to-digital conversion with only N steps, using two capacitors. These capacitors enable obtaining at each step a reference voltage $VR_i = VR/2^i$ and either to compute a voltage $V_{i+1} = V_i - VR_i$ if the $i^{th}$ bit is equal to 1 or to retain the voltage $V_{i+1} = V_i$ if the $i^{th}$ bit is equal to 0. At each step, the voltage $V_i$ is compared to the reference voltage $VR_i$ in order to determine the value of the $i^{th}$ bit.

5 Claims, 5 Drawing Figures

ANALOG-TO-DIGITAL CONVERTER

BACKGROUND OF THE INVENTION

This invention relates to an analog-to-digital converter and more particularly a converter of this type which utilizes the principle of charge distribution between two capacitors of identical capacity.

A conversion circuit of the type mentioned above and designed using MOS (abbreviation for Metal Oxide Semiconductor) technology has already been described in an article by R. E. Suarez, P. R. Gray and D. A. Hodges, appearing in: IEEE Journal of Solid-State Circuits, Vol. SC-10, No. 6 of December 1975. The principle of conversion used is that of conversion by successive approximations, and the analog-to-digital converter described is built around a digital-to-analog conversion circuit which contains two capacitors of equal value. The analog-to-digital converter described permits carrying out a conversion of N bits in $N^2/2$ iterations and the experimental MOS design model requires a time of 100 μs for a conversion of eight bits.

SUMMARY OF THE INVENTION

An object of this invention is to provide an analog-to-digital converter of the type mentioned above and which carries out a conversion of N bits in N iterations.

Another object of this invention is to provide an analog-to-digital converter of the type mentioned above, but of higher speed.

The analog-to-digital converter of this invention is designed to furnish in N iterations the numerical value in N bits of an analog input voltage V1 from a reference voltage VR and is characterized by the fact that on each iteration:

an analog voltage Vi is compared to a reference voltage VRi obtained by dividing the reference voltage of the preceding iteration by two so that:

$$VRi = VR/2^i;$$

the $i^{th}$ bit is equal to 1 if the analog voltage Vi is greater than the reference voltage VRi, and is equal to 0 if the analog voltage Vi is lower than the reference voltage VRi; and if the $i^{th}$ bit is equal to 1, the reference voltage VRi is subtracted from the analog voltage Vi to calculate the analog voltage for the next iteration, that is $Vi+1 = Vi - VRi$, and if the $i^{th}$ bit is equal to 0, the analog voltage Vi is retained for the next iteration, that is $Vi+1 = Vi$.

According to another characteristic of the invention, the analog-to-digital converter contains:

a first group and a second group of two capacitors of identical capacity;

first means for charging a capacitor of the first group to the reference voltage VR;

second means for dividing, between the two capacitors of the first group, the charge existing on one of them;

third means for charging a capacitor of the second group to the analog input voltage;

fourth means for charging, on one of the capacitors of the second group, the difference between the voltage present on the other capacitor of the second group and the voltage existing across one capacitor of the first group;

fifth means for comparing the voltages at the terminals of a capacitor of the first group and at the terminals of a capacitor of the second group; and sixth means to store the result of each comparison.

BRIEF DESCRIPTION OF THE DRAWINGS

Other objects, characteristics and advantages of this invention will be brought out more clearly in the following description of a particular embodiment, the description being given purely as an illustration and in connection with the attached drawings in which.

DESCRIPTION OF THE PREFERRED EMBODIMENT

Figure 1:
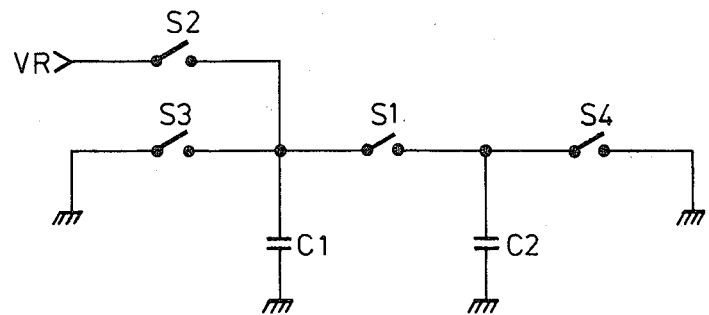
FIG. 1 is a schematic diagram of a digital-to-analog conversion circuit already known to the art.
Figure 2:
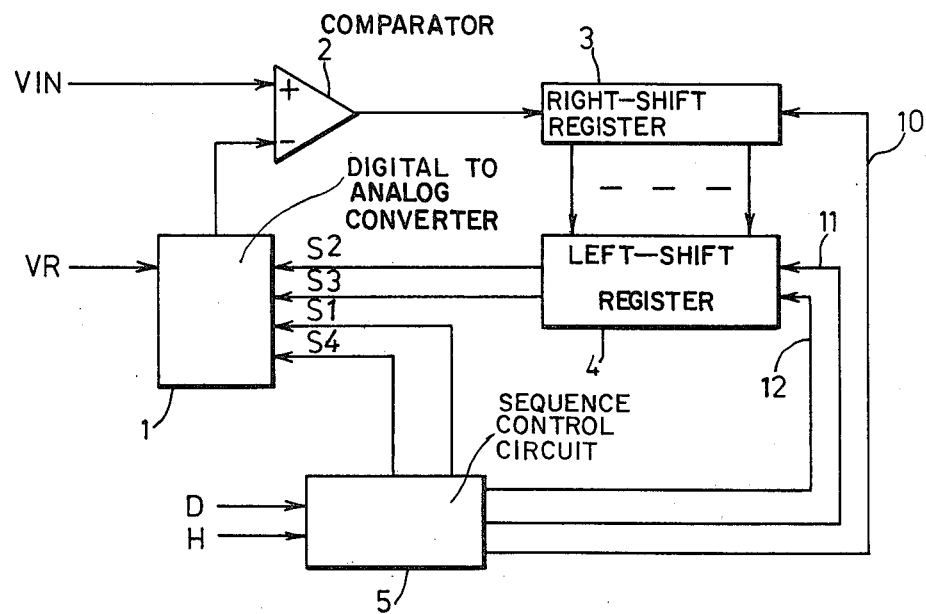
FIG. 2 shows a block diagram of a known analog-to-digital converter using the circuit of FIG. 1.

FIGS. 1 and 2 illustrate a design already known to the art, particularly as a result of the above mentioned article. FIG. 1 shows schematically a digital-to-analog conversion circuit whose operation will now be explained. Capacitors C1 and C2 are in principle of the same value. Conversion is carried out by taking first the least significant bit, for example d1. Capacitor C1 is connected either to a reference voltage VR through switch S2 if d1 is equal to 1, or to ground through switch S3 if d1 is equal to 0. While C1 is charging, capacitor C2 is connected to ground through switch S4. Switches S2, S3 and S4 are then opened, after which switch S1 is closed to permit a distribution of the charge between the two capacitors C1 and C2. The voltages V1(1) and V2(1), at the terminals of capacitors C1 and C2, respectively, then have the value:

$$V1(1) = V2(1) = d1 \cdot (VR/2).$$

The charge of C2 is then maintained and the preceding operation is repeated, this time taking the next least significant bit, for example d2. After charge redistribution, the resulting voltages will be:

$$V1(2) = V2(2) = \tfrac{1}{2}(d2 + (d1/2))VR.$$

The operation is repeated again with the following bits up to the most significant bit so that, if there are K bits, the following voltages are obtained after K redistributions:

$$V1(K) = V2(K) = \sum_{i=1}^{K} \frac{2^i d_i}{2^{K+1}} VR.$$

The above described digital-to-analog conversion circuit can be used to construct an analog-to-digital converter operating by successive approximations, such as the one shown in FIG. 2. The illustrated converter contains a digital-to-analog conversion circuit 1 of FIG. 1, a comparator 2, a right-shift register 3, a left-shift register 4, and a sequence control circuit 5. In an analog-to-digital conversion, it is the most significant bit which should be determined first. The sequence control circuit 5 receives an external start order D and a clock signal H. Circuit 5 delivers the control signals for switches S1 and S4, the right-shift control signals 10, register 3 to register 4 transfer control signals 11, and the left-shift control signals 12. At a given instant in the conversion operation, the inputs to circuit 1 correspond to the word which has just been coded beginning with the least significant bit. The total number of iterations and, consequently, the conversion time is high, which limits its possibilities of utilization.

Figure 3:
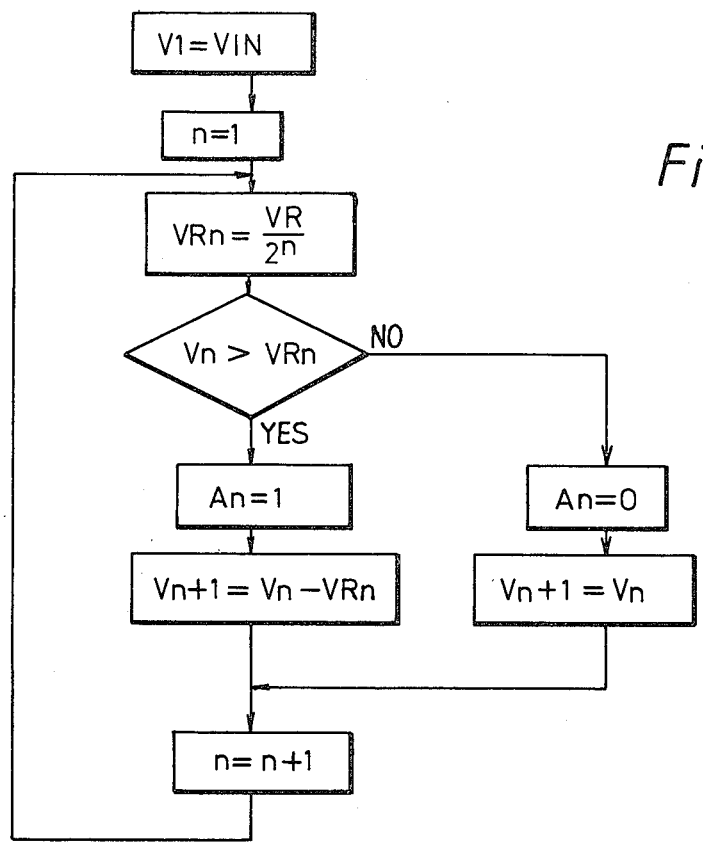
FIG. 3 is a flow diagram illustrating the operating principle of an analog-to-digital converter in accordance with the principles of the present invention.
Figure 5:
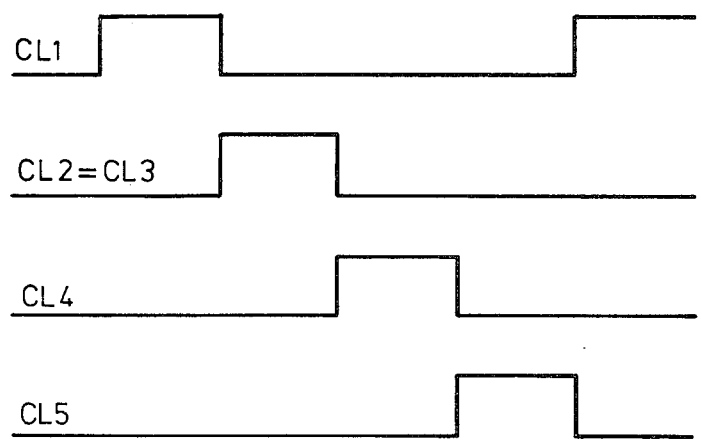
FIG. 5 illustrates the sequence of the signals used in the converter of FIG. 4.

Thus the present invention proposes an analog-to-digital converter which requires fewer iterations and is therefore faster. This advantage will be illustrated in the following description of a particular embodiment given in connection with FIGS. 3 to 5. FIG. 3 illustrates a flow diagram of the conversion principle used in the converter according to the present invention. The analog voltage to be coded VIN is compared to a reference voltage VR/2. If the reference voltage is greater than the analog voltage, the bit sought is 0 and the analog voltage is then compared to the preceding reference voltage divided by two. If the reference voltage is lower than the analog voltage, the bit sought is 1 and the analog voltage, reduced by the value of the reference voltage, is then compared to the reference voltage divided by two. The operation is repeated until all the bits are determined.

Figure 4:
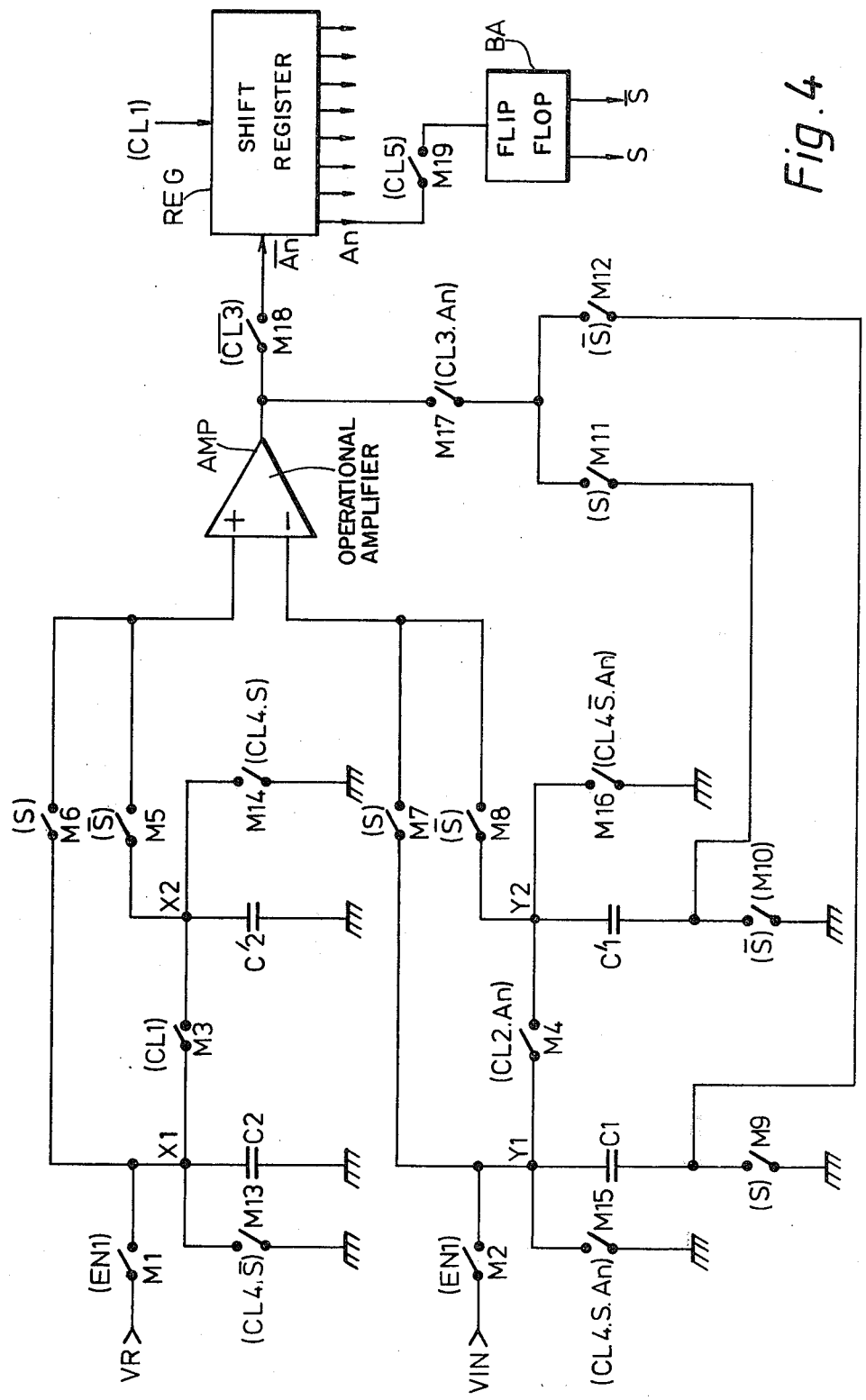
FIG. 4 is a schematic of an analog-to-digital converter in accordance with the principles of the invention.

Examination of the circuit in FIG. 4 shows how this invention makes use of the conversion principle set forth above. The circuit in FIG. 4 contains two groups of capacitors, C1 and C'1 on the one hand, and C2 and C'2 on the other hand, which are connected respectively to the analog input voltage VIN to be coded and to the reference voltage VR. All the previously described operations are carried out by switches M2, M4, M15 and M16 for the first group of capacitors C1 and C'1 and switches M1, M3, M13 and M14 for the second group of capacitors C2 and C'2, that is to say the charging and discharging of a capacitor and charge distribution between two capacitors. An operational amplifier AMP can compare the voltage existing across the terminals of a capacitor of the first group, via switches M7 or M8, with the voltage existing across the terminals of a capacitor of the second group, via switches M5 or M6. The output of the amplifier AMP is applied through a switch M18 to a shift register REG and also to the lower plate of capacitors C1 or C'1 through switches M17 and M12 or M17 and M11 respectively. The control signals have been shown between parentheses at the side of the switches in question and the time sequence of control signals CL1 to CL5 has been shown in FIG. 5. The signals S and $\overline{S}$ are obtained by means of a flip-flop BA receiving the last information applied to register REG, that is An. The signal EN1 is a pulse produced at the beginning of the conversion operation.

The operation of the circuit of FIG. 4 will be examined in detail below. The analog voltage to be coded VIN can be expressed as a function of the reference voltage VR in the following manner:

$$VIN = A1(VR/2) + A2(VR/4) + \cdots - + An(VR/2^n) + \cdots.$$

The function of the converter is to determine the value, 0 or 1, of the coefficients A1 to An. We have shown in a general way with FIG. 3 how these coefficients are determined. We shall now consider, in relation to FIG. 4, the various steps of the conversion.

At the beginning, on pulse EN1, capacitor C1 is charged to the analog input voltage VIN through M2 and capacitor C2 is charged to the reference voltage VR through M1. The signal S is initialized to the value 1. On clock pulse CL1, the charge of C2 is distributed between C2 and C'2 through M3. The signal CL3 then being at 0, the output state of the amplifier AMP used as a comparator is entered in the register REG. Since signal S is at 1, this comparison is made between the voltages at points X1 and Y1 through switches M6 and M7. The output state of amplifier AMP corresponds to the inverse value of An(A1), or $\overline{An}$.

If the voltage at Y1, that is to say V(Y1), is greater than the voltage at X1, that is to say V(X1), An is then equal to 1 (it is equal to 0 in the opposite case). When An is equal to 1 and on pulse CL2=CL3, the amplifier AMP is then used in feedback in such a way that, with switches M17, M11, M4, M7 and M6 closed, capacitor C'1 is charged to the voltage V2=VIN−VR/2. On pulse CL4, the capacitor C'2 is discharged through M14 and capacitor C1 is discharged through M15. On pulse CL5, flip-flop BA changes state and $\overline{S}$ changes to 1. Then, a new iteration is carried out by comparison between V2 and VR/4.

If, on the other hand, the voltage V(Y1) is lower than the voltage V(X1), the bit An(A1) is then equal to 0. In that case, capacitor C'2 is discharged on pulse CL4 through M14 and a new iteration takes place without change of state of the flip-flop BA or change in the voltage at the terminals of capacitor C1.

In more general terms, on the $n^{th}$ iteration, the reference voltage present on C2 or C'2 is divided by two by closing M3 on pulse CL1 and we obtain $VRn = VR/2^n$. The amplifier AMP compares VRn with Vn to determine the coefficient An. This comparison is made either between V(X1) and V(Y1) if S is at 1, or between V(X2) and V(Y2) if S is at 0. If An is equal to 1, the amplifier AMP is then used in feedback and, on pulse CL3=CL2, causes the voltage $Vn+1 = Vn - VRn$ to appear across the terminals of capacitor C'1 if S is at 1 or capacitor C1 if S is at 0. In all cases, the difference $Vn - VRn$ appears across the capacitor which did not contain Vn. When the coefficient An is equal to 1, flip-flop BA changes state on pulse CL5.

If An is equal to 0, the capacitor C'2 or the capacitor C2, according to whether S is a 1 or a 0, is discharged on pulse CL4 and a new iteration can take place.

On each iteration, the coefficients An are stored in the shift register REG which shifts on pulse CL1. After K iterations, if K is the number of bits of the converter, register REG contains the digital value of the analog input voltage VIN. The converter of the invention therefore furnishes the desired result with much fewer iterations and, consequently, in much less time than the aforesaid mentioned prior art converter.

The circuit of the invention is designed for integrated MOS technology and, for this reason, maximum symmetry was sought. Actually, since on each iteration the reference voltage is divided by two, the same point, X1 or X2, could be used for making the comparison. Therefore, one of the switches, M5 or M6, could be eliminated. Similarly, only one of the discharge switches, M13 or M14, needs to be retained. However, the chosen solution permits the effect of stray capacities of switches M5, M6, M13 and M14 to be minimized since they are distributed between the points X1 and X2.

Although this invention has been described in connection with a particular embodiment, it is clearly not limited to the embodiment and is capable of modifications or variants still lying within its scope.

What is claimed is:

1. An analog-to-digital converter to provide in N iterations an N-bit digital value for an analog input voltage from a reference voltage, where N is an integer greater than one, comprising:
 a single stage used for each of said N iterations including
  a first pair of capacitors each having identical capacity,
  a second pair of capacitors each having identical capacity and equal to the capacity of each of said first pair of capacitors,
  first means coupled to said first pair of capacitors for charging one of said first pair of capacitors to said reference voltage,
  second means coupled between said first pair of capacitors for selectively dividing said charge on said one of said first pair of capacitors between both capacitors of said first pair of capacitors,
  third means coupled to said second pair of capacitors for charging one of said second pair of capacitors to said analog input voltage,
  fourth means coupled between said second pair of capacitors for selectively dividing said charge on said one of said second pair of capacitors between both capacitors of said second pair of capacitors,
  fifth means coupled to said first and second pairs of capacitors for comparing the voltage at the terminals of a selected one of said first pair of capacitors with the voltage at the terminals of a selected one of said second pair of capacitors, and
  sixth means selectively coupled to said fifth means and to a selected one of said second pair of capacitors to charge said selected one of said second pair of capacitors with a voltage equal to the difference between the voltage present on the other of said second pair of capacitors and the voltage present on said selected one of said first pair of capacitors; and
 a seventh means coupled to said fifth means to store a binary result of each comparison performed by said fifth means.

2. A converter according to claim 1, wherein each of said first, second, third, fourth and sixth means includes an electronic switch.

3. A converter according to claims 1 or 2, wherein said fifth means includes an operational amplifier having a non-inverting input selectively coupled to said first pair of capacitors, an inverting input selectively coupled to said second pair of capacitors and an output selectively coupled to said sixth means and said seventh means.

4. A converter according to claim 3, wherein said seventh means includes a shift register.

5. A converter according to claims 1 or 2, wherein said seventh means includes a shift register.

* * * * *